(12) United States Patent
Kim

(10) Patent No.: US 11,146,082 B2
(45) Date of Patent: Oct. 12, 2021

(54) METHOD OF PREVENTING BATTERY DISCHARGE AND ELECTRONIC CONTROL UNIT PERFORMING THE SAME

(71) Applicant: Hyundai Autron Co., Ltd., Seoul (KR)

(72) Inventor: Kyoung Tae Kim, Anyang-si (KR)

(73) Assignee: Hyundai Autron Co., Ltd., Seoul (KR)

( * ) Notice: Subject to any disclaimer, the term of this patent is extended or adjusted under 35 U.S.C. 154(b) by 210 days.

(21) Appl. No.: 16/382,012

(22) Filed: Apr. 11, 2019

(65) Prior Publication Data

US 2019/0319467 A1   Oct. 17, 2019

(30) Foreign Application Priority Data

Apr. 12, 2018 (KR) .................. 10-2018-0042750

(51) Int. Cl.
*H02J 7/00* (2006.01)
*G01R 31/3835* (2019.01)

(52) U.S. Cl.
CPC ........ *H02J 7/0031* (2013.01); *G01R 31/3835* (2019.01); *H02J 7/0063* (2013.01); *H02J 2007/0067* (2013.01)

(58) Field of Classification Search
CPC .......... H02J 7/00; H02J 7/0031; H02J 7/0063; G01R 31/3835
See application file for complete search history.

(56) References Cited

U.S. PATENT DOCUMENTS

| 6,586,911 B1* | 7/2003 | Smith | H04W 52/0277 320/134 |
| 2018/0086290 A1* | 3/2018 | Makke | B60R 16/0315 |

FOREIGN PATENT DOCUMENTS

| JP | 2007-237868 A | 9/2007 |
| KR | 10-2012-0088905 A | 8/2012 |
| KR | 10-2017-0014962 A | 2/2017 |
| KR | 10-2017-0059844 A | 5/2017 |

* cited by examiner

*Primary Examiner* — Robert Grant
(74) *Attorney, Agent, or Firm* — Morgan, Lewis & Bockius LLP

(57) ABSTRACT

Disclosed is a method for an electronic control unit to prevent the discharge of a battery. The method includes the steps of detecting an off signal of vehicle function power connected to a battery and monitoring a voltage of the battery, detecting a low voltage of the battery based on a result of the monitoring and transmitting an operation inhibition signal for preventing power consumption of the battery to a plurality of controllers, and determining whether the plurality of controllers switch to a sleep mode in response to the operation inhibition signal.

12 Claims, 6 Drawing Sheets

METHOD OF PREVENTING BATTERY DISCHARGE AND ELECTRONIC CONTROL UNIT PERFORMING THE SAME

CROSS REFERENCE TO RELATED APPLICATION

This application is based on and claims priority under 35 U.S.C. 119 to Korean Patent Application No. 10-2018-0042750, filed on Apr. 12, 2018, in the Korean Intellectual Property Office, the disclosures of which is herein incorporated by reference in their entireties.

BACKGROUND OF THE INVENTION

1. Technical Field

The present invention relates to an electronic control unit and a method of preventing the discharge of a battery and, more particularly, to a method and electronic control unit for preventing the discharge of a battery attributable to an error of controllers after the off of vehicle function power.

2. Description of the Related Art

In general, a power source mounted on a vehicle is configured with battery power and generator power. The battery power is used to drive a startup motor when the vehicle is initially driven or used when an engine is stopped.

The amount of power that may be supplied by only the battery for vehicle is limited because the battery for vehicle has a limited charge capacity. For this reason, the battery may be discharged if the engine of the vehicle is stopped and power does not continue to be supplied by the generator.

A recently developed vehicle consumes a lot of battery power because it is equipped with multiple convenience devices or network controllers (hereinafter referred to as "controllers") which are always driven by the battery power for vehicle.

The controllers are designed to operate using a background current even after the startup of the vehicle has been turned off. The controllers are designed to enter a low power mode at the same time through a network management message when a task is completed in order to prevent battery discharge.

However, when a problem occurs in a specific controller, the specific controller continues to transmit a network management message to the vehicle. Accordingly, there is a problem in that the battery is discharged because all the controllers do not enter the low power mode.

Accordingly, in order to prevent the discharge of a battery power source mounted on the vehicle, there is a need for an apparatus capable of periodically monitoring power of the battery even after the off of vehicle function power and controlling controllers.

The present invention has been made to solve the problems.

PATENT DOCUMENT

Korean Patent Application Publication No. 10-2012-0088905 (Aug. 9, 2012)

SUMMARY OF THE INVENTION

An embodiment of the present invention proposes a method of preventing the discharge of a battery, which can enable controllers to enter a low power mode regardless of the current state of the controllers when a low voltage of a battery is detected after the off of vehicle function, and an electronic control unit performing the same.

An embodiment of the present invention proposes a method of preventing the discharge of a battery, which can minimize a danger of battery discharging by entering the remaining controllers other than a specific controller having an error into a low power mode, and an electronic control unit performing the same.

Objects of the present invention are not limited to the above-described objects, and other objects not described above may be evidently understood by those skilled in the art to which the present invention pertains from the following description.

A method for an electronic control unit (ECU) to prevent the discharge of a battery, the method includes the steps of detecting an off signal of vehicle function power (IGN) connected to a battery and monitoring a voltage of the battery, detecting a low voltage of the battery based on a result of the monitoring and transmitting an operation inhibition signal for preventing power consumption of the battery to a plurality of controllers, and determining whether the plurality of controllers switch to a sleep mode in response to the operation inhibition signal.

According to one embodiment, the method may further include the step of changing the plurality of controllers, shifted to the sleep mode, to a low power mode after the step of determining whether the controllers switch to the sleep mode, if it is determined that all of the plurality of controllers has switched to the sleep mode in the step of determining whether the controllers switch to the sleep mode.

According to one embodiment, the method may further include the step of transmitting a wakeup deactivation signal to a specific controller of the plurality of controllers after the step of determining whether the controllers switch to the sleep mode, if it is determined that the specific controller has not switched to the sleep mode in the step of determining whether the controllers switch to the sleep mode.

According to one embodiment, the method may further include the step of directly changing a controller to which the wakeup deactivation signal has not been transmitted, from among the plurality of controllers, to a low power mode, without the intervention of the sleep mode after the step of transmitting the wakeup deactivation signal.

According to one embodiment, the method may further include the step of releasing the low power mode of the plurality of controllers when the on signal of the vehicle function power is detected after the step of switching to the low power mode.

According to one embodiment, the method may further include the step of releasing the low power mode of the plurality of controllers when the battery is charged with a preset voltage value or more based on a result of the monitoring after the step of switching to the low power mode.

An electronic control unit according to another embodiment of the present invention includes a monitoring unit configured to monitor a battery voltage in response to an off signal of vehicle function power (IGN) connected to a battery, a communication unit configured to transmit an operation inhibition signal for preventing power consumption of the battery to a plurality of controllers when a low voltage of the battery is detected based on a result of the monitoring of the monitoring unit, and a control unit configured to determine whether the plurality of controllers switches to a sleep mode in response to the operation inhibition signal of the communication unit and to control the plurality of controllers based on a result of the determination.

According to one embodiment, the control unit mat change the plurality of controllers, shifted to the sleep mode, to a low power mode if it is determined that all of the plurality of controllers have switched to the sleep mode.

According to one embodiment, if the control unit determines that a specific controller of the plurality of controllers has not switched to the sleep mode, the communication unit may transmit a wakeup deactivation signal to the specific controller.

According to one embodiment, the control unit may directly change a controller to which the communication unit has not transmitted the wakeup deactivation signal, from among the plurality of controllers, to a low power mode without the intervention of the sleep mode.

According to one embodiment, the control unit may release the low power mode of the plurality of controllers when the on signal of the vehicle function power is detected.

According to one embodiment, the control unit may release the low power mode of the plurality of controllers when the battery is charged with a preset voltage value or more based on a result of the monitoring of the monitoring unit.

Figure 1:
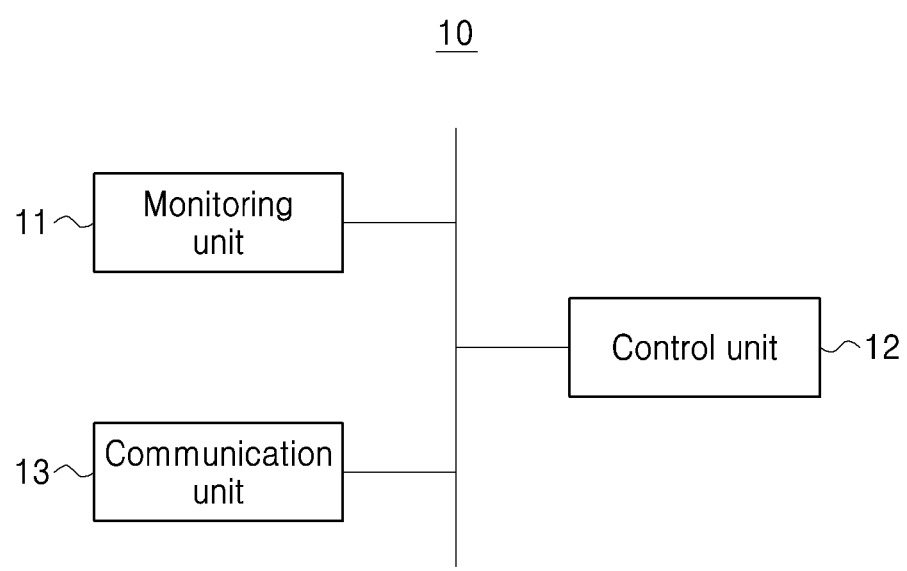
FIG. 1 shows the configuration of an electronic control unit according to a first embodiment of the present invention.

<Description of reference numerals of principal elements in the drawings>

100: battery discharge prevention system
10: electronic control unit   11: monitoring unit
12: control unit   13: communication unit
20: first controller   30: second controller
40: third controller   50: battery

DETAILED DESCRIPTION

Hereinafter, embodiments of the present invention are described in detail with reference to the accompanying drawings. The merits and characteristics of the disclosure and a method for achieving the merits and characteristics will become more apparent from the embodiments described in detail in conjunction with the accompanying drawings. However, the disclosure is not limited to the disclosed embodiments, but may be implemented in various different ways. The embodiments are provided to only complete the disclosure and to allow those skilled in the art to fully understand the category of the disclosure. The disclosure is defined by the category of the claims. The same reference numerals will be used to refer to the same or similar elements throughout the drawings.

All terms (including technological and scientific terms) used in the specification, unless defined otherwise, will be used as meanings which can be understood by a person having ordinary skill in the art to which the present invention pertains in common.

Furthermore, terms that are commonly used and defined in dictionaries should not be construed as having ideal or excessively formal meanings unless defined otherwise. Terms used in the specification are provided to describe the embodiments and are not intended to limit the present invention. In the specification, the singular form, unless specially described otherwise, may include the plural form.

Furthermore, a term, such as "comprise (or include)" and/or "comprising (or including)" used in the specification, do not exclude the existence or addition of one or more elements in addition to the described elements.

Hereinafter, the present invention is described more specifically with reference to the accompanying drawings.

Figure 2:
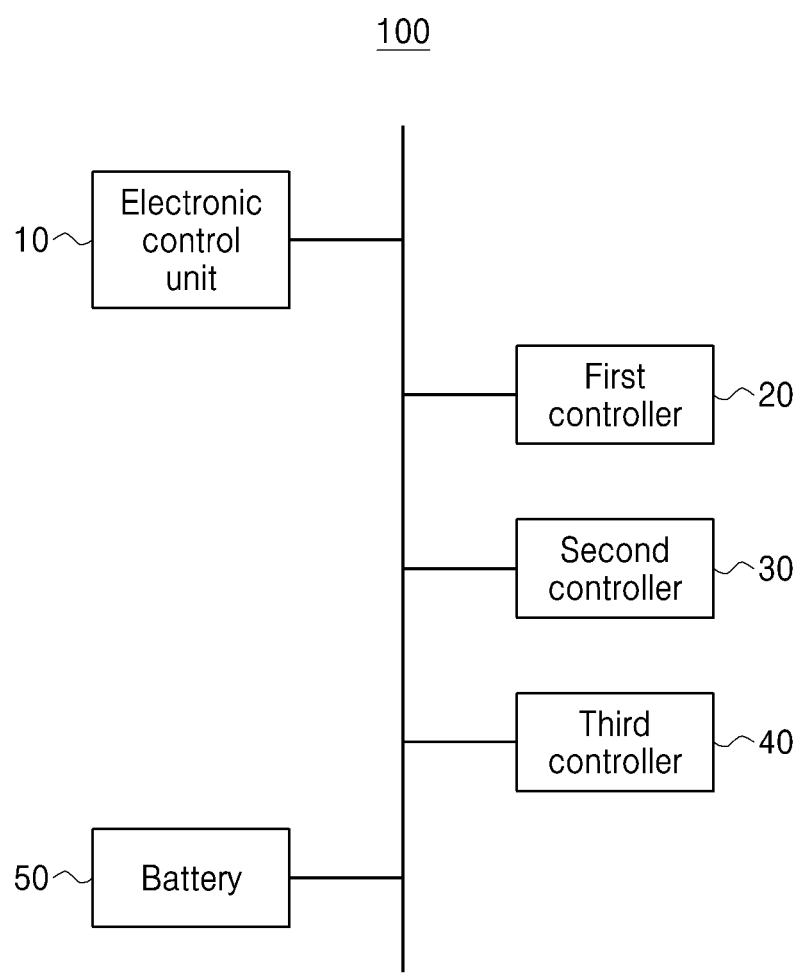
FIG. 2 shows the configuration of a battery discharge prevention system according to a second embodiment of the present invention.

FIG. 1 shows the configuration of an electronic control unit 10 according to a first embodiment of the present invention. FIG. 2 shows the configuration of a battery discharge prevention system 100 according to a second embodiment of the present invention.

In the following description, the elements of the electronic control unit 10 shown in FIG. 1 are described using a first controller 20, a second controller 30, a third controller 40, for example, and a battery 50 shown in FIG. 2.

Furthermore, in the following description, the elements included in the electronic control unit 10 according to the first embodiment of the present invention are individually described, but this is only one embodiment of the elements, and any one element and the other element may be implemented in a merged form.

The electronic control unit 10 may be mounted on a vehicle as an independent part, but may be implemented as one element or function of an electronic control unit (ECU) mounted on a vehicle.

Referring to FIG. 1, the electronic control unit 10 may include a monitoring unit 11, a control unit 12 and a communication unit 13, and may further include other additional elements necessary to achieve an object of the present invention.

The monitoring unit 11 may monitor at least one of a voltage of the battery (B+, BATTERY PLUS IGN KEY) 50 connected to the outside of the electronic control unit 10 and vehicle function power (IGN). For example, the monitoring unit 11 may monitor operating characteristics, such as a voltage, current and charge state of the battery 50, and may monitor the power state of a power device necessary to move the vehicle, such as the electronic control unit (ECU) of vehicle function power (IGN), an air back, and a dashboard.

Furthermore, a process for the monitoring unit 11 to monitor a voltage of the battery 50 or the state of the vehicle function power (IGN) also consumes power of the battery 50. The monitoring unit 11 may start monitoring by considering the off signal of the vehicle function power (IGN) as a trigger signal.

Accordingly, when the off signal of the vehicle function power (IGN) and a battery low voltage are detected, the monitoring unit 11 may determine the operating state of other function devices connected to the battery 50 by periodically monitoring a voltage of the battery 50 and the on/off state of the vehicle function power (IGN) from the time when monitoring is started. This is described more specifically later.

The control unit 12 may control the state of the plurality of controllers 20, 30 and 40 based on a result of the monitoring of the monitoring unit 11. More specifically, when a low voltage of the battery 50 is detected based on a result of monitoring, the control unit 12 may transmit an operation inhibition signal (INHIBITION MESSAGE) for preventing power consumption of the battery 50 to the plurality of controllers 20, 30 and 40.

For example, the control unit 12 may generate an NM message in which a bit of the operation inhibition signal has been set to 1, and may transmit the NM message to the plurality of controllers 20, 30 and 40.

In a conventional technology, the plurality of controllers 20, 30 and 40 connected to the battery 50 share mutual states after each of the controllers completes its operation, and switches to a sleep mode in order to switch to a low power mode. At this time, in order to switch to the sleep mode, an agreement for switching to the sleep mode must be previously performed between all of the plurality of controllers 20, 30 and 40.

In this case, if an error occurs in one of the plurality of controllers 20, 30 and 40, all the plurality of controllers 20, 30 and 40 fails in switching to the sleep mode for switching to the low power mode because a controller having an error does not agree with switching to the sleep mode. Accordingly, the battery 50 becomes a discharge state via a low voltage state.

However, the control unit 12 according to an embodiment of the present invention previously transmits an operation inhibition signal to the plurality of controllers 20, 30 and 40 based on a voltage state of the battery 50 monitored by the monitoring unit 11 so that the operations of the controller having an error and the remaining controllers are stopped.

In other words, when the control unit 12 transmits the operation inhibition signal, all the plurality of controllers 20, 30 and 40 consider that an agreement for switching to the sleep mode has been be made, so the plurality of controllers 20, 30 and 40 may switch to the sleep mode and to the low power mode.

As described above, the above error of the controller may be a relatively simple software logic error or hardware error. If a fatal software error or hardware error occurs in a controller related to the safety of a vehicle, the controller may be implemented to not recognize an operation inhibition signal although it is transmitted so that an NM message continues to be transmitted.

In order to identify a controller having an error as described above, the control unit 12 may determine whether all the plurality of controllers 20, 30 and 40 has switched to the sleep mode after the operation inhibition signal is transmitted by the plurality of controllers 20, 30 and 40.

Accordingly, the control unit 12 may deactivate the wakeup of the controller having an error in order to prevent the corresponding controller from continuously transmitting the NM message.

The communication unit 13 is network means for connecting the electronic control unit 10 and the plurality of controllers 20, 30 and 40. The electronic control unit 10 and the plurality of controllers 20, 30 and 40 may transmit and receive signals through the communication unit 13. More specifically, the communication unit 13 may transmit an operation inhibition signal, generated by the control unit 12, to the plurality of controllers 20, 30 and 40.

In this case, the communication unit 13 may perform communication according to a controller area network (CAN) communication method, and may use any one of known communication methods.

A method of reducing unnecessary power consumption of the battery 50 mounted on a vehicle and preventing battery discharge using the electronic control unit 10 according to the first embodiment of the present invention is described below.

Figure 3:
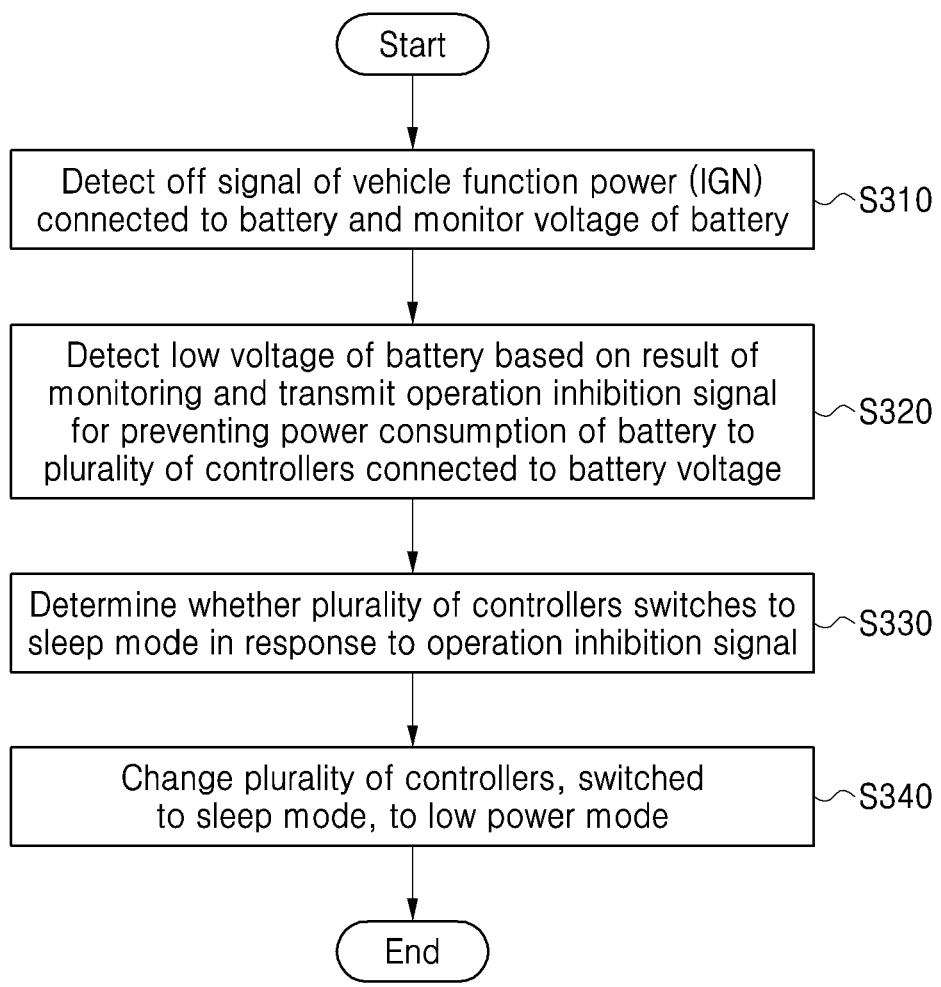
FIG. 3 is a flowchart showing a method of preventing the discharge of a battery according to a third embodiment of the present invention.

FIG. 3 is a flowchart showing a method of preventing the discharge of a battery according to a third embodiment of the present invention.

The method is only one embodiment for achieving an object of the present invention. Some steps may be deleted from or added to the method or any one step may be included in another step, if necessary.

Referring to FIG. 3, the monitoring unit 11 detects the off signal of the vehicle function power (IGN) connected to the battery 50, and monitors a voltage of the battery 50 connected to the first controller 20, the second controller 30 and the third controller 40 (S310).

As described above, when the vehicle function power (IGN) is off, the first controller 20, the second controller 30 and the third controller 40 perform respective operations using power of the battery 50 and must switch to the sleep mode at the same time. When an error occurs in a controller, all the first controller 20, the second controller 30 and the third controller 40 fail in switching to the sleep mode and continues to consume power of the battery 50, thereby causing the discharge of the battery 50.

Thereafter, the monitoring unit 11 detects a low voltage of the battery 50. The control unit 12 transmits an operation inhibition signal for preventing power consumption of the battery 50 to the first controller 20, the second controller 30 and the third controller 40 (S320).

All the first controller 20, the second controller 30 and the third controller 40 that have received the operation inhibition signal must stop all their operations and switch to the sleep mode.

Thereafter, the control unit 12 determines whether the first controller 20, the second controller 30 and the third controller 40 have switched to the sleep mode in response to the operation inhibition signal (S330). At this time, if all the first controller 20, the second controller 30 and the third controller 40 have not switched to the sleep mode, the control unit 12 may additionally perform a process for preventing the discharge of the battery 50. This is described later with reference to FIG. 4.

Step S330 of FIG. 3 is a determination step and may be basically drawn in a diamond form, but has been illustrated in a rectangular form, for convenience of description. The step is described more specifically later with reference to FIG. 4.

If it is determined that all the first controller 20, the second controller 30 and the third controller 40 have switched to the sleep mode in response to the operation inhibition signal, the control unit 12 changes the first controller 20, the second controller 30 and the third controller 40, switched to the sleep mode, to a low power mode (S340).

As described above, when a voltage of the battery 50 is a low voltage state, the control unit 12 recognizes the low voltage state as a danger signal and immediately changes the first controller 20, the second controller 30 and the third controller 40 to the low power mode, thereby being capable of minimizing a danger of battery discharge.

The method of preventing the discharge of a battery according to the third embodiment of the present invention has been described so far with reference to FIG. 3. According to an embodiment of the present invention, after the off signal of the vehicle function power (IGN) is detected, the first controller 20, the second controller 30 and the third controller 40 may be changed to the low power mode in the low voltage state of the battery 50. Accordingly, the time taken for battery discharge can be extended.

Step S340 is performed after all the first controller 20, the second controller 30 and the third controller 40 switch to the sleep mode at step S330. If an error occurs in any one of the first controller 20, the second controller 30 and the third controller 40 and thus all the controllers do not switch to the sleep mode, how the first controller 20, the second controller 30 and the third controller 40 will be controlled becomes a problem. This is related to FIG. 4 and described below.

Figure 4:
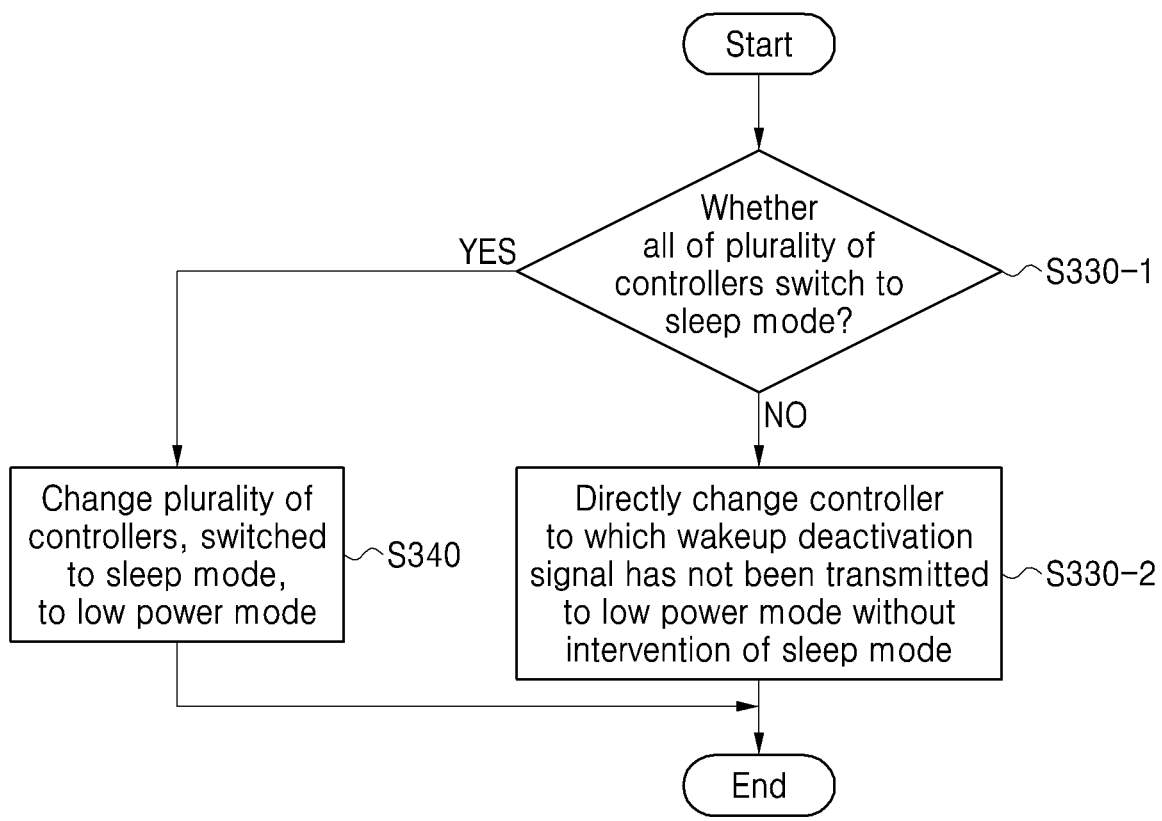
FIG. 4 is a detailed flowchart illustrating step S330 of FIG. 3.
Figure 5:
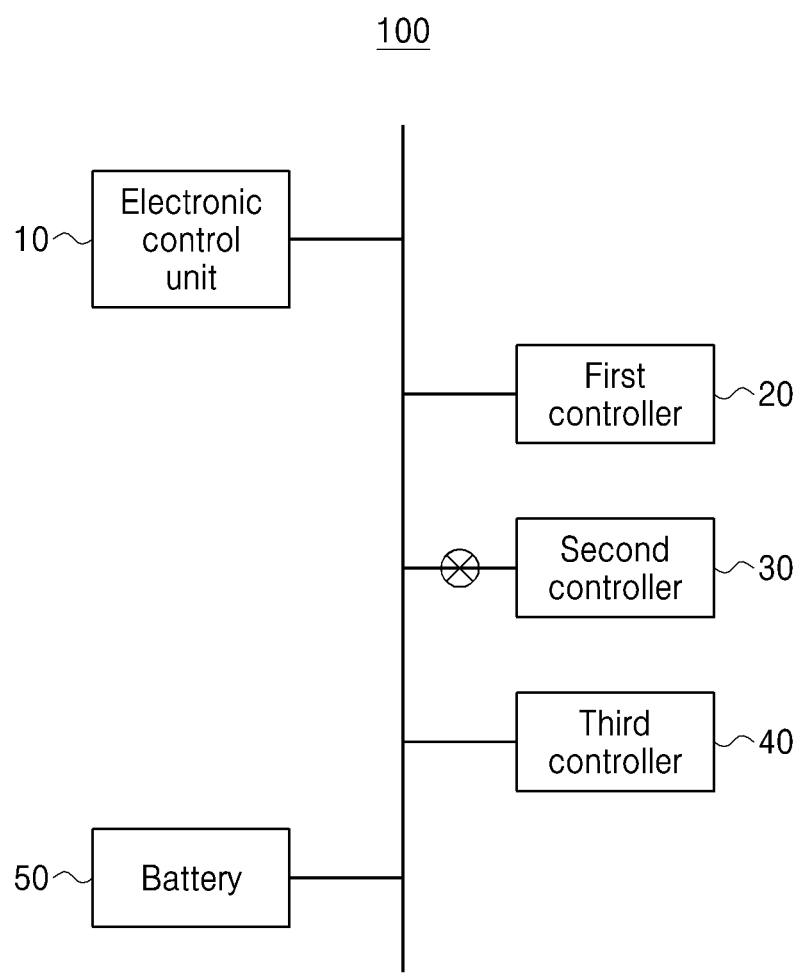
FIG. 5 is a diagram showing the state in which controllers are controlled by the battery discharge prevention system according to the second embodiment of the present invention.

FIG. 4 is a detailed flowchart illustrating step S330 of FIG. 3. FIG. 5 is a diagram showing the state in which controllers are controlled by the battery discharge prevention system 100 according to the second embodiment of the present invention.

Referring to FIG. 4, first, the control unit 12 determines whether all the plurality of controllers switch to the sleep mode in response to the operation inhibition signal (S330-1).

If it is determined that all the first controller 20, the second controller 30 and the third controller 40 have not switched to the sleep mode, the control unit 12 transmits a wakeup deactivation signal to a specific controller (e.g., second controller) that has not switched to the sleep mode (S330-2, NO). If it is determined that all the first controller 20, the second controller 30 and the third controller 40 have switched to the sleep mode, the control unit 12 performs step S340 of FIG. 3.

The remaining controllers (e.g., first controller and third controller) except the specific controller (e.g., second controller) to which the wakeup deactivation signal has been transmitted cannot be forced to enter the sleep mode because they continue to transmit an NM message that requests a network connection.

Accordingly, as shown in FIG. 5, the wakeup of the specific controller (e.g., second controller) is deactivated, so the control unit 12 can control the state of the remaining controllers (e.g., first controller and third controller).

The control unit 12 deactivates the specific controller (e.g., second controller) in which an error has occurred, and directly changes the remaining controllers (e.g., first controller and third controller) in which an error has not occurred to a low power mode without the intervention of the sleep mode (S330-3).

As described above, if an agreement is not made between all the first controller 20, the second controller 30 and the third controller 40, the controllers cannot switch to the sleep mode. The control unit 12 directly changes the remaining controllers (e.g., first controller and third controller), not having an error, to the low power mode, thereby being capable of extending the time taken for battery discharge.

In the state in which the mode of the first controller 20, the second controller 30 and the third controller 40 has switched to the low power mode under the control of the control unit 12, the monitoring unit 11 may periodically monitor a voltage of the battery 50 and the on/off state of the vehicle function power (IGN), and may transmit a result of the monitoring to the control unit 12 so that an operating state, such as that all the controllers remain switched to the sleep mode, all the controllers switch to the low power mode state, or all the controllers are activated again and perform respective operations, may be determined. This is described below reference to FIG. 6.

Figure 6:
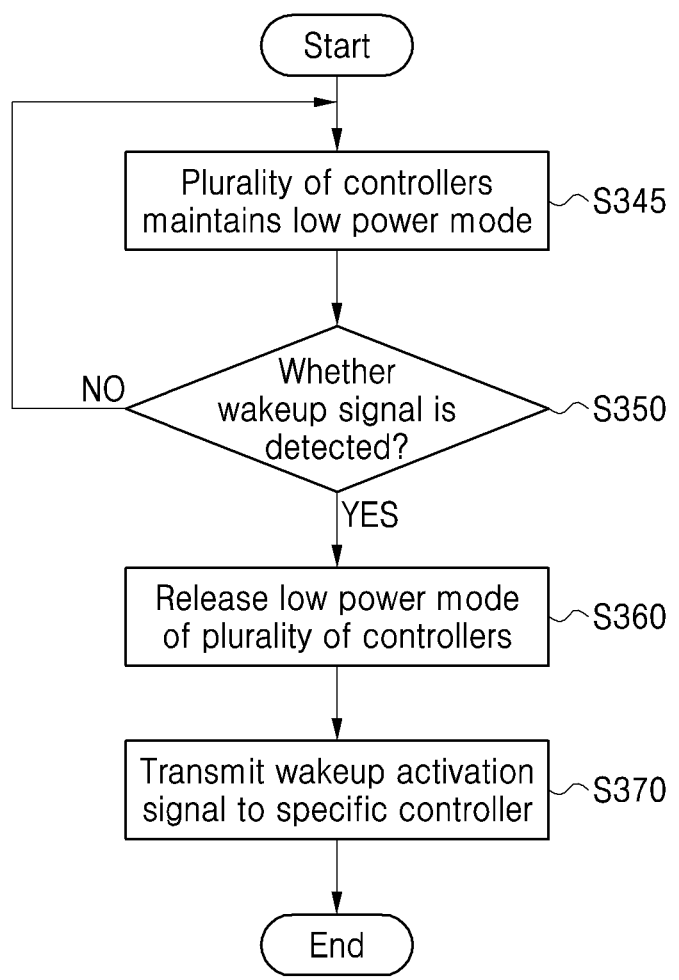
FIG. 6 is a flowchart illustrating a method for controllers to release a low power mode after a method of preventing the discharge of a battery according to a third embodiment of the present invention.

FIG. 6 is a flowchart illustrating a method for controllers to release a low power mode after a method of preventing the discharge of a battery according to a third embodiment of the present invention.

Referring to FIG. 6, first, a plurality of controllers maintains a low power mode (S345). In this case, the plurality of controllers may mean controllers that receive an operation inhibition signal from the control unit 12 and that have switched to a low power mode or the remaining controllers whose wakeup has not deactivated.

The monitoring unit 11 checks whether a wakeup signal is received from the outside connected to the electronic control unit 10 (S350). In this case, the wakeup signal may include the vehicle function power (IGN) connected to the monitoring unit 11, the startup of a vehicle, the on signal of an engine, and a case where a voltage of the battery 50 is charged to a given value or more.

The control unit 12 that has received the wakeup signal releases the low power mode of the plurality of controllers (S360). If there is a specific controller whose wakeup has been deactivated, the control unit 12 activates the wakeup if the specific controller again (S370).

Accordingly, the plurality of controllers (e.g., first controller, second controller and third controller) included in the battery discharge prevention system 100 use the battery 50 to a minimum extent although an error occurs in a specific controller, thereby being capable of preventing the discharge of the battery 50.

Furthermore, the series of methods performed for battery discharge as described above may be used in a general-purpose way because they do not affect other devices which may be connected to the electronic control unit 10.

According to the embodiments of the present invention, there is an effect in that the time taken for battery discharge can be extended because when a low voltage is detected, the electronic control unit changes controllers, connected to a battery, to a sleep mode and then to a low power mode.

Furthermore, a wakeup deactivation signal is transmitted to a specific controller that cannot switch to the sleep mode. Accordingly, there is an effect in that battery discharge can be prevented because the remaining controllers except the specific controller maintain the low power mode.

Furthermore, there is an effect in that the method of preventing the discharge of a battery can be used in a general-purpose way because it does not affect the execution of the functions of other devices installed on a vehicle.

Effects of the present invention are not limited to the above-described objects, and other effects not described above may be evidently understood by those skilled in the art to which the present invention pertains from the following description.

Although the embodiments of the present invention have been described with reference to the accompanying drawings, those skilled in the art to which the present invention pertains may understand that the present invention may be implemented in other detailed forms without changing the technical spirit or essential characteristics of the present invention. Accordingly, it is to be understood that the above-described embodiments are only illustrative, but are not limitative in all aspects.

What is claimed is:

1. A method for an electronic control unit (ECU) to prevent a discharge of a battery, the method comprising steps of:

detecting an off signal of vehicle function power (IGN) connected to a battery and monitoring a voltage of the battery;

detecting a low voltage of the battery, which is lower than a predetermined voltage, based on a result of the monitoring and transmitting an operation inhibition signal for preventing power consumption of the battery to a plurality of controllers; and determining, by a control unit of the ECU, whether the plurality of controllers switch to a sleep mode in response to the operation inhibition signal received by the plurality of controllers, wherein, in the step of determining whether the plurality of controllers switch to the sleep mode, the control unit is configured for differently controlling shifting of the plurality of controllers to a low power mode after the step of determining whether the plurality of controllers switch to the sleep mode, according to whether all of the plurality of controllers has switched to the sleep mode or a specific controller among the plurality of controllers has not switched to the sleep mode.

2. The method of claim 1, further comprising a step of changing, by the control unit, the plurality of controllers, shifted to the sleep mode, to the low power mode after the step of determining whether the plurality of controllers switch to the sleep mode, if it is determined that all of the plurality of controllers has switched to the sleep mode in the step of determining whether the controllers switch to the sleep mode.

3. The method of claim 1, further comprising a step of transmitting, by the control unit, a wakeup deactivation signal to the specific controller among the plurality of controllers after the step of determining whether the plurality of controllers switch to the sleep mode, if it is determined that the specific controller has not switched to the sleep mode in the step of determining whether the plurality of controllers switch to the sleep mode.

4. The method of claim 3, further comprising a step of directly changing, by the control unit, a controller to which the wakeup deactivation signal has not been transmitted, from among the plurality of controllers, to a low power mode, without an intervention of the sleep mode after the step of transmitting the wakeup deactivation signal.

5. The method of claim 2, further comprising a step of releasing, by the control unit, the low power mode of the plurality of controllers when an on signal of the vehicle function power is detected after the step of switching to the low power mode.

6. The method of claim 2, further comprising a step of releasing, by the control unit, the low power mode of the plurality of controllers when the battery is charged with a value equal to or greater than a preset voltage value based on a result of the monitoring after the step of switching to the low power mode.

7. An electronic control unit, comprising:
a monitoring unit configured to monitor a battery voltage in response to an off signal of vehicle function power (IGN) connected to a battery;
a communication unit configured to transmit an operation inhibition signal for preventing power consumption of the battery to a plurality of controllers when a low voltage of the battery, which is lower than a predetermined voltage, is detected based on a result of the monitoring of the monitoring unit; and
a control unit configured to determine whether the plurality of controllers switches to a sleep mode in response to the operation inhibition signal of the communication unit and to control the plurality of controllers based on a result of the determination,
wherein the control unit is configured for differently controlling shifting of the plurality of controllers to a low power mode after the determining whether the plurality of controllers switch to the sleep mode, according to whether all of the plurality of controllers has switched to the sleep mode or a specific controller among the plurality of controllers has not switched to the sleep mode.

8. The electronic control unit of claim 7, wherein the control unit changes the plurality of controllers, shifted to the sleep mode, to the low power mode if it is determined that all of the plurality of controllers have switched to the sleep mode.

9. The electronic control unit of claim 7, wherein if the control unit determines that the specific controller of the plurality of controllers has not switched to the sleep mode, the communication unit transmits a wakeup deactivation signal to the specific controller.

10. The electronic control unit of claim 9, wherein the control unit directly changes a controller to which the communication unit has not transmitted the wakeup deactivation signal, from among the plurality of controllers, to a low power mode without an intervention of the sleep mode.

11. The electronic control unit of claim 8, wherein the control unit releases the low power mode of the plurality of controllers when an on signal of the vehicle function power is detected.

12. The electronic control unit of claim 8, wherein the control unit releases the low power mode of the plurality of controllers when the battery is charged with a value equal to or greater than a preset voltage value based on a result of the monitoring of the monitoring unit.

* * * * *